HEAT SINK ARRANGEMENT FOR A SEMICONDUCTOR DEVICE

Filed April 3, 1968

INVENTORS
AMAURY PIEDRA
HENRY J. CAMPBEL
BY
ATTORNEY

United States Patent Office 3,526,814
Patented Sept. 1, 1970

3,526,814
HEAT SINK ARRANGEMENT FOR A SEMICONDUCTOR DEVICE

Amaury Piedra and Henry J. Campbell, North Palm Beach, Fla., assignors to International Telephone and Telegraph Corporation, Nutley, N.J., a corporation of Delaware Filed Apr. 3, 1968, Ser. No. 718,524
Int. Cl. H01l 3/00, 5/00
U.S. Cl. 317—234 11 Claims

ABSTRACT OF THE DISCLOSURE

This invention provides a means of mounting high power semiconductor devices with improved means for heat dissipation. The improvement consists in embedding a dielectric heat conducting material such as beryllium oxide in glass which is layered onto a ceramic base or support.

BACKGROUND OF THE INVENTION

In the production of semiconductor devices, for example, transistors and integrated circuits, it is desirable to protect the device from mechanical damage by enclosing it in a rigid container or by encapsulating it in a plastic or ceramic container. It is also desirable to keep oxygen and moisture away from the device in order to prevent deterioration of important electrical device parameters. Both of these objects are generally accomplished by hermetically sealing the semiconductor device inside the container or case.

An important additional requirement is that the container or semiconductor device enclosure should readily transfer to a heat sink the heat dissipated by the operation of the semiconductor device, since otherwise the device may become over-heater and degrade or fail during prolonged operation. A number of procedures have been utilized to provide heat dissipation for encapsulating semiconductor devices but these procedures tend to be relatively complex and expensive or inefficient.

Accordingly, it is an object of this invention to provide an improved heat sink arrangement for a semiconductor device.

Another object of this invention is to provide an improved heat sink arrangement for a semiconductor device which is relatively simple and inexpensive to fabricate.

SUMMARY OF THE INVENTION

This invention provides an improved heat sink arrangement where the dielectric heat transfer material is embedded in a glass layer disposed over a ceramic substrate and the semiconductor chip is placed on the dielectric material.

DESCRIPTION OF THE INVENTION

This invention will be more clearly understood by reference to the accompanying drawings, in which.

Figure 1:
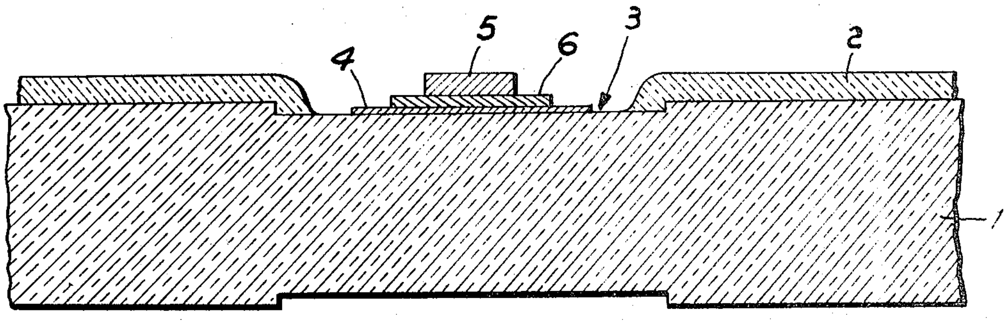
Fig. 1 (PRIOR ART)
FIG. 1 shows an example of the prior art of a portion of an integrated circuit.

In the prior art arrangement of FIG. 1, there is shown a ceramic substrate 1 with a glass layer 2 disposed on the surface of the substrate except for the area 3 where the semiconductor chip or die would be placed. In the region 3 on the surface of the ceramic substrate 1 is disposed platinum-gold dot 4. The platinum-gold dot is placed on the ceramic substrate by conventional techniques such as applying the gold in the form of a paste to the ceramic and firing in a furnace at 950° C.; the platinum is then plated on the gold. The semiconductor die 5 is then fastened to the platinum-gold dot by means of a soft solder 6. The platinum-gold layer generally provides for a good contact between the die and the ceramic base and also provides good heat dissipation. However, in the manufacturing process it is necessary to mask the platinum-gold dot before the glazing process can be done. This masking is time consuming and expensive.

Figure 2:
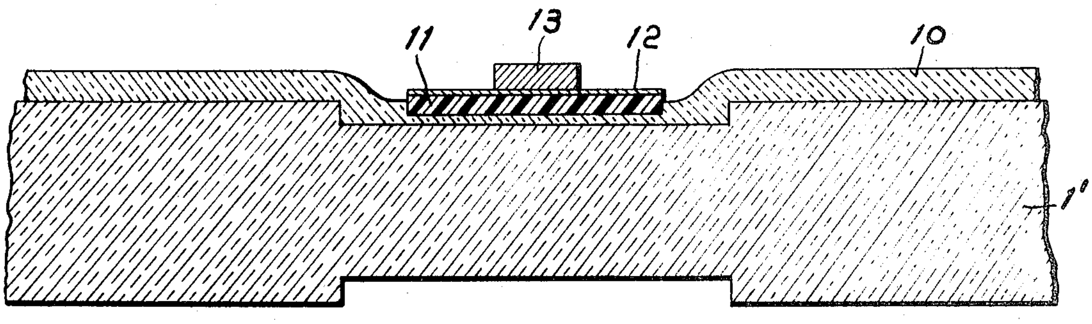
FIG. 2 shows the embodiment of the improved arrangement of this invention.

In the improved arrangement of this invention shown in FIG. 2, a glaze glass was used having the following composition:

(a) Owens-Illinois Solder Glass CV 97—15 lb.
(b) Drakenfeld Black Dye No. 41152—41.4 gm.
(c) TAM Super Pax $ZrSeO_4$—225 gm.
(d) U.S. Industrial Chemical Co. Solox—2,250 ml.
(e) Baker & Adamson Ammonium Hydroxide—78 ml.

The ingredients are properly mixed and spread over the ceramic substrate. In the region where the die is to be placed, there is set in the glaze glass composition 10 a beryllium oxide chip 11, the upper side of which has a hard solder surface. The substrate 1' with the glass glaze 10 and the ceramic ship 11 thereon is then placed in an oven and maintained for ten minutes at a temperature of 425° C. to melt the glass and embed the beryllium chip 11 therein. The substrate 1' is then removed from the oven and cooled. The final operation consists in soldering the semiconductor die 13 to the soldered surface 12 of the beryllium chip.

Figure 3:
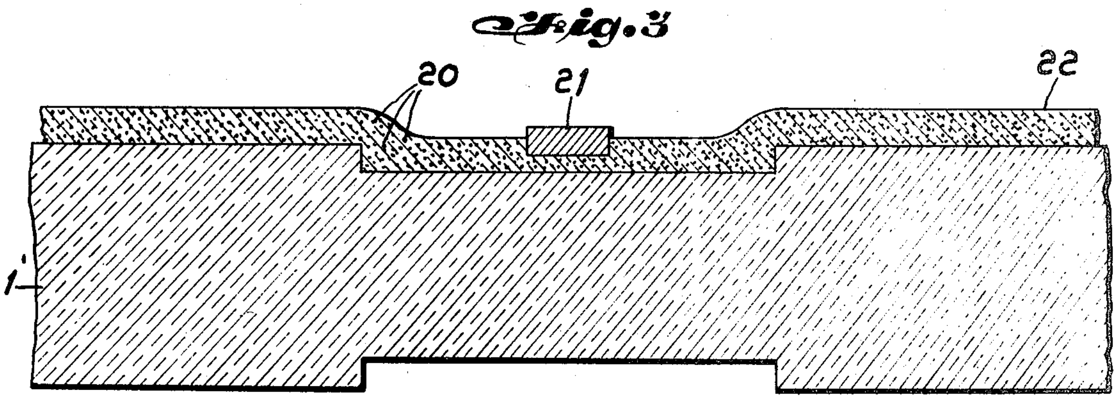
FIG. 3 shows another embodiment of the improved arrangement of this invention.

In the second embodiment of this invention shown in FIG. 3, a mixture of the glaze glass composition referred to above is made with beryllium oxide microspheres 20 thoroughly mixed therein. The diameter of the beryllium oxide microspheres is greater than mesh #325, or .0017 in. diameter, and the density of the mixture should be in the area of 85% microspheres by volume to provide suitable heat disipation. In the same fashion as shown in the arrangement of FIG. 3, the semiconductor die 21 is placed on the glass composition 22 and the assembly is then moved in an oven at a temperature of 425° C. for a period of ten minutes and then cooled at room temperature.

The semiconductor die may be a fabricated diode, transistor or integrated circuit.

While we have described above the principles of our invention in connection with specific apparatus, it is to be clearly understood that this description is made only by way of example and not as a limitation to the scope of our invention as set forth in the objects thereof and in the accompanying claims.

We claim:

1. A semiconductor device having improved heat dissipation properties comprising
a dielectric base,
a vitreous layer disposed over said base,
a heat dissipating dielectric material embedded in said vitreous layer, and
a semiconductor member disposed on said heat dissipating dielectric material.

2. A semiconductor device according to claim 1 wherein said heat dissipating material is in the form of a flat member.

3. A semiconductor device according to claim 1 where said heat dissipating material is in the form of pellets interspersed within the vitreous layer.

4. A semiconductor device according to claim 1 wherein said heat dissipating dielectric material is beryllium oxide.

5. A semiconductor device according to claim 1 wherein said vitreous material is a low temperature melting glass.

6. A semiconductor device according to claim 3 wherein the mixture of said vitreous material and said pellets is in the area of 85% pellets by volume.

7. A semiconductor device according to claim 3 wherein the diameter of each said pellets is greater than .0017 inch.

8. A heat conducting electrically insulating composition comprising a vitreous material and a dielectric heat transfer material.

9. A heat conducting electrically insulating composition according to claim 8 wherein said dielectric heat transfer material is in the form of pellets interspersed within said vitreous material.

10. A heat conducting electrically insulating composition according to claim 8 wherein said dielectric heat transfer material is beryllium oxide.

11. A heat conducting electrically insulating composition according to claim 9 wherein the composition of said vitreous material and said pellets is in the area of 85% pellets by volume.

References Cited

UNITED STATES PATENTS

| | | | |
|---|---|---|---|
| 3,021,461 | 2/1962 | Oakes et al. | 317—234 |
| 3,341,649 | 9/1967 | James | 317—234 |
| 3,361,868 | 1/1968 | Bachman | 317—234 |
| 3,377,522 | 4/1968 | Tsuji et al. | 317—235 X |
| 3,405,224 | 10/1968 | Yawata et al. | 317—234 X |

JOHN W. HUCKERT, Primary Examiner

A. J. JAMES, Assistant Examiner

U.S. Cl. X.R.

117—212; 148—187